United States Patent
Barnette et al.

(10) Patent No.: US 10,716,210 B2
(45) Date of Patent: Jul. 14, 2020

(54) PRINTED CIRCUIT BOARD INCLUDING THROUGH-HOLE VIAS

(71) Applicant: HEWLETT PACKARD ENTERPRISE DEVELOPMENT LP, Houston, TX (US)

(72) Inventors: Christopher M Barnette, Plano, TX (US); William K Fitzgerald, Plano, TX (US); Michael Day, Plano, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/759,577

(22) PCT Filed: Sep. 15, 2015

(86) PCT No.: PCT/US2015/050124
§ 371 (c)(1),
(2) Date: Mar. 13, 2018

(87) PCT Pub. No.: WO2017/048232
PCT Pub. Date: Mar. 23, 2017

(65) Prior Publication Data
US 2019/0132951 A1    May 2, 2019

(51) Int. Cl.
H05K 1/11    (2006.01)
H05K 1/02    (2006.01)

(52) U.S. Cl.
CPC .......... *H05K 1/113* (2013.01); *H05K 1/0298* (2013.01); *H05K 2201/09227* (2013.01);
(Continued)

(58) Field of Classification Search
CPC . H05K 2201/09627; H05K 2201/0979; H05K 2201/09254; H05K 1/115;
(Continued)

(56) References Cited

U.S. PATENT DOCUMENTS 4,785,141 A * 11/1988 Nishihara ........... H01L 23/5383
174/266
7,131,047 B2 * 10/2006 Welbon .............. G01R 31/2808
714/734
(Continued)

FOREIGN PATENT DOCUMENTS

JP    2014-103236    6/2014
KR    10-1077439 B1    10/2011

OTHER PUBLICATIONS

Holden, H., "HDI Technology's Influence on signal Integrity," (Web Page), EE Times, Sep. 28, 2001, 5 pages, http://www.eetimes.com/document.asp?doc_id=11438.

(Continued)

*Primary Examiner* — Roshn K Varghese
(74) *Attorney, Agent, or Firm* — Hewlett Packard Enterprise Patent Department

(57) ABSTRACT

Various examples provide a printed circuit board (PCB) comprising a first route from a first through-hole via to a second through-hole via, and a second route from the second through-hole via to a first microvia (e.g., coupled to a second memory module socket). Additional microvias may have a route from the first microvia that effectively daisy chains the microvias from the second through-hold via. Various examples also provide a PCB comprising a first route from a first through-hole via to a second through-hole via, and a second route from the second through-hole via to a first sequential lamination via. Additional sequential lamination vias may have a route from the first microvia that effectively daisy chains the sequential lamination vias from the second through-hold via.

3 Claims, 7 Drawing Sheets

(52) U.S. Cl.
CPC .............. *H05K 2201/09254* (2013.01); *H05K 2201/10159* (2013.01); *H05K 2201/10189* (2013.01)

(58) Field of Classification Search
CPC ................. H05K 1/113; H05K 1/0298; H05K 2201/09227; H05K 2201/10159; H05K 2201/10189
See application file for complete search history.

(56) References Cited

U.S. PATENT DOCUMENTS

| | | | | |
|---|---|---|---|---|
| 7,441,221 B2* | 10/2008 | Kawamichi | ......... | G06F 17/5068 716/137 |
| 7,523,545 B2* | 4/2009 | Kumar | ................. | H05K 3/4614 29/830 |
| 8,102,667 B2* | 1/2012 | Underwood | ........ | G06F 17/5072 174/259 |
| 8,321,829 B2 | 11/2012 | Nakano | | |
| 8,440,916 B2* | 5/2013 | Li | ........................ | H05K 3/0032 174/263 |
| 8,692,136 B2* | 4/2014 | Oh | ........................... | G01R 3/00 174/267 |
| 9,907,155 B2 | 2/2018 | Numao Takashi et al. | | |
| 2004/0040744 A1 | 3/2004 | Wyrzykowska et al. | | |
| 2006/0180917 A1* | 8/2006 | Djordjevic | ........... | H05K 1/0216 257/691 |
| 2007/0205498 A1 | 9/2007 | Djordjevic et al. | | |
| 2008/0025007 A1* | 1/2008 | Ao | ......................... | H05K 1/115 361/760 |
| 2010/0307798 A1 | 12/2010 | Izadian | | |
| 2012/0241207 A1 | 9/2012 | Huang et al. | | |
| 2013/0050968 A1* | 2/2013 | Huang | ................. | H05K 1/0265 361/783 |
| 2014/0192583 A1 | 7/2014 | Rajan et al. | | |
| 2014/0203417 A1 | 7/2014 | Altunyurt et al. | | |
| 2014/0268614 A1 | 9/2014 | Zhang et al. | | |

OTHER PUBLICATIONS

PCT/ISA/KR, International Search Report and Written Opinion, dated May 31, 2016, PCT/US2015/050124, 12 pages.

* cited by examiner

PRINTED CIRCUIT BOARD INCLUDING THROUGH-HOLE VIAS

BACKGROUND

A printed circuit board (PCB) can comprise a set of vias, conductive lines (hereafter, routes), and conductive pads to conductively couple various points of the printed circuit board together, in doing so, a PCB can interconnect various passive and active passive components (e.g., capacitors, resistors, transistors, semiconductor chips) to implement some or all of an electronic system, in some instances, a PCB can further include connection components, such as card-edge connectors, which permit the PCB (e.g., implementing a computer memory system) to conductively couple with other PCBs (e.g., a Single In-Line Memory Module [SIMM] or a Dual in-line Memory Module [DIMM]).

BRIEF DESCRIPTION OF THE DRAWINGS

Certain examples are described in the following detailed description in sampled to the following drawings.

DETAILED DESCRIPTION

Figure 1:
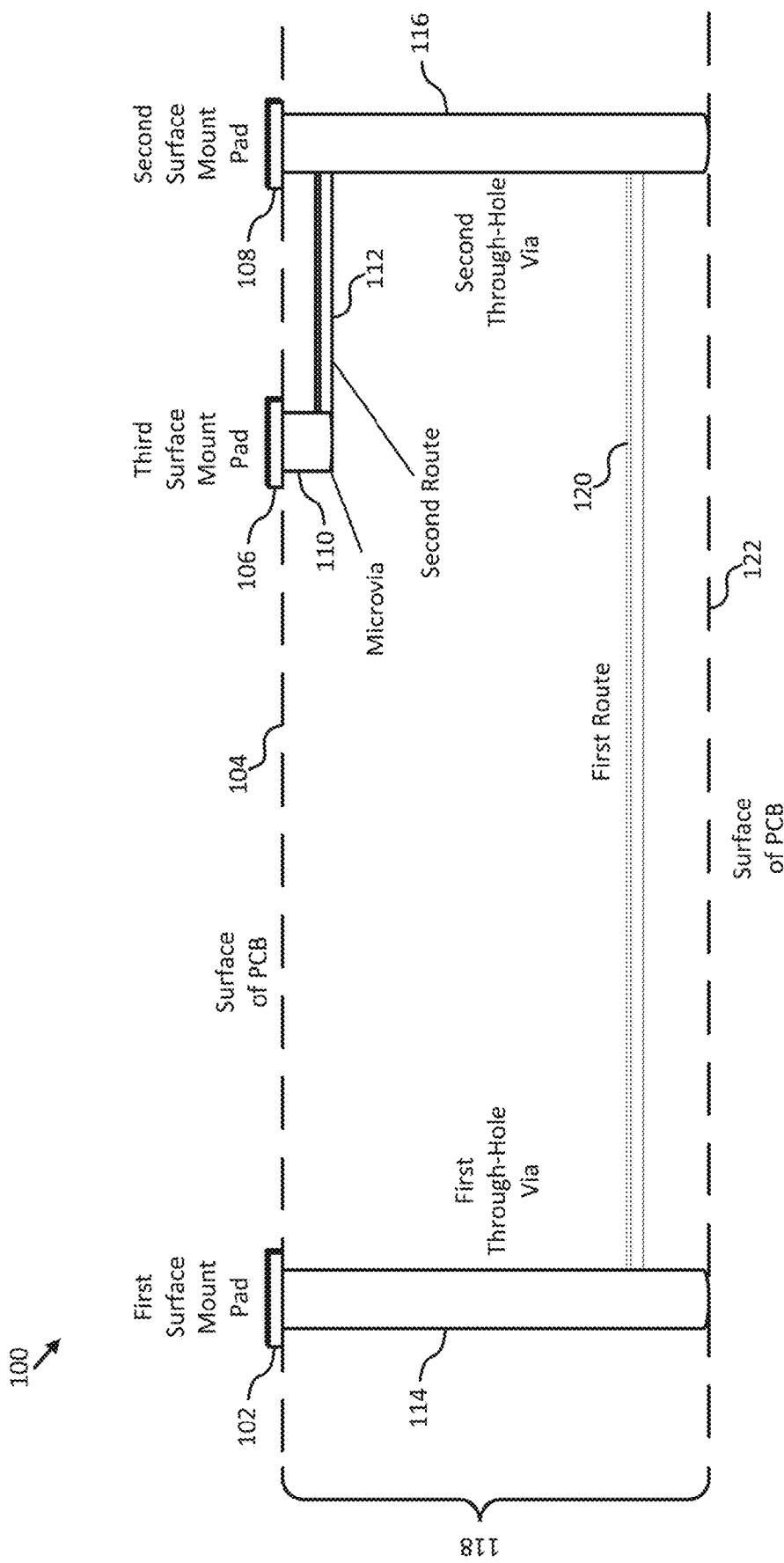
FIGS. 1 through 5B are block diagrams illustrating example printed circuit boards according to the present disclosure.

Conventional techniques for using and arranging vias, routes, memory module sockets (e.g., Dual In-line Memory Module [DIMM] sockets), memory chips (e.g., memory buffer chips) result in the memory module sockets being spread out across a printed circuit board (e.g., mainboard of a computer system). Unfortunately, this requires the printed circuit board (PCB) be of a certain size to accommodate a particular density of the memory module sockets.

Various examples described herein utilize vias and routes to permit dense arrangement of electronic components on a printed circuit board (PCB). In particular, with respect to a PCB, various examples utilize a first routing strategy where a route is run from a first through-hole via (e.g., coupled to a memory buffer chip) to a second through-hole via (e.g., coupled to a first memory module socket), and a route is run from the second through-hole via to a first microvia (e.g., coupled to a second memory module socket). To include additional vias in the PCB, those vias can be implemented as microvias having a shared route from an adjacent microvia, thereby forming a daisy chain topology from the second through-hole via. For instance, a second microvia (e.g., coupled to a third memory module socket) may be implemented and a route can be run from the first microvia to the second microvia. This method of using routes and microvias may continue according to space available on the PCB. For some examples, additional microvias daisy chained from the second through-hole via may be disposed between the second through-hole via and the first through-hole via, thereby permitting surface-mounted electronic components (e.g., memory module sockets) conductively coupled to the second through-hole via and the microvias to be densely arranged next to the surface-mounted electronic component (e.g., memory buffer chip) conductively coupled to the first through-hole via.

Various examples may also utilize a second routing strategy where a route is run from a first through-hole via (e.g., coupled to a memory buffer chip) to a second through-hole via (e.g., coupled to a first memory module socket), and a route is run from the second through-hole via to a first sequential lamination via (e.g., coupled to a second memory module socket). To include additional vias in the PCB, those vias can be implemented as sequential lamination vias having a shared route from an adjacent sequential lamination via, thereby forming a daisy chain topology from the second through-hole via. For instance, a second sequential lamination via (e.g., coupled to a third memory module socket) may be implemented and a route can be run from the first sequential lamination via to the second sequential lamination via. This method of using routes and sequential lamination vias may continue according to space available on the PCB. For some examples, sequential lamination vias daisy chained from the second through-hole via may be disposed between the second through-hole via and the first through-hole via thereby permitting surface-mounted electronic components (e.g., memory module sockets) conductively coupled to the second through-hole via and the sequential lamination vias to be densely arranged next to the surface-mounted electronic component (e.g., memory buffer chip) conductively coupled to the first through-hole via. The second routing strategy may be utilized in addition to, or in place of, the first strategy based on routing congestion on the PCB.

The various vias may conductively couple to electronic components mounted on the surface of the printed circuit board (PCB). Such couplings may be enabled by surface mount pads (e.g., solder pads) on the surface of the PCB, which facilitate physically and conductively coupling electronic components to the PCB.

Some examples described herein are used to implement a computer memory system comprising a memory chip (e.g., memory buffer chip) and a plurality of memory module sockets, each of which may receive a removable memory module (e.g., a Single In-Line Memory Module [SIMM] or a Dual In-line Memory Module [DIMM]). The computer memory system may implement double data rate (DDR) bus technology, where each memory module socket of the plurality is coupled in a daisy chain topology. For instance, the computer memory system may comprise a DDR bus coupling a memory buffer chip to three Dual In-line Memory Module (DIMM) sockets that are daisy chained together using vias and routes as described herein.

The following provides a detailed description of the examples illustrated by FIGS. 1-6. Though some of the illustrated examples may be described with respect to a computer memory system, the examples described herein may also be applicable to any electronic system that utilizes a printed circuit board, such as daughter boards that serves as video cards, network cards, and redundant array of inexpensive disks (RAID) controller card. The computer memory system may be part of a mainboard of a computer system, such as a desktop, laptop, table, smartphone, or the like.

FIG. 1 is a block diagram illustrating an example printed circuit board (PCB) 100 according to the present disclosure. In particular, FIG. 1 illustrates a cross section 118 of the PCB 100, which may comprise a plurality of internal layers (not shown) that permit conductive routing between internal points of the PCB 100. Accordingly, two vias included by the PCB 100 can intersect a particular internal layer of the PCB 100, and a route disposed on that particular internal layer can conductively couple the two vias. For some examples, the PCB 100 comprises twenty-four layers.

As illustrated, the PCB 100 comprises: a (top) surface 104 and a (bottom) surface 122; a first surface mount pad 102, a second surface mount pad 108, and a third surface mount pad 106 disposed on the surface 104 of the PCB 100; a microvia 110 conductively coupled to the third surface mount pad 106; a first through-hole via 114 conductively coupled to the first surface mount pad 102; a second through-hole via 116 conductively coupled to the second surface mount pad 108; a second route 112 conductively coupling the microvia 110 and the second through-hole via 116; and a first route 120 conductively coupling the first through-hole via 114 and the second through-hole via 116. One or more of components 102, 106, 108, 110, 112, 114, 116, and 120 may comprise copper.

For some examples, each of the second route 112 and the first route 120 are disposed separate internal layers of the printed circuit hoard (PCB) 100. Additionally, for some examples, the second route 112 is disposed on a higher internal layer of the PCB 100 (e.g., third internal layer) and the first route 120 is disposed on a lower internal layer of the PCB 100 (e.g., twentieth internal layer). As shown, the second route 112 is disposed on an internal layer of the PCB 100 that intersects with the microvia 110 and the second through-hole via 116, and the first route 120 is disposed on an internal layer that intersects with the first through-hole via 114 and the second through-hole via 116.

According to some examples, the first and second through-hole vias 114, 116 extends from the top surface 104 of the PCB 100 to the bottom surface 122 of the PCB 100. Additionally, for some examples, the microvia 110 extends down from the top surface 104 two or three internal layers.

Each of the first surface mount pad 102, the second surface mount pad 108, and the third surface mount pad 106 may permit an electronic component to be surface mounted on a surface of the PCB 100 (e.g., 104 or 122) and to be conductively couple to a via. Each of the surface mount pads 102, 106, and 108 may comprise copper and may be further plated with tin-lead, silver or gold. Examples of such electronic components may include, without limitation, capacitors, resistors, transistors, semiconductor chips, or connectors (e.g., card-edge connectors, such as memory module sockets or expansion slots). For instance, the first surface mount pad 102 may be coupled to a semiconductor chip (e.g., memory buffer chip) disposed on the surface 104, the second surface mount pad 108 may be coupled to a card-edge connector (e.g., memory module socket compatible with a Dual In-line Memory Module [DIMM]), the third surface mount pad 106 may be coupled to another card-edge connector (e.g., another memory module socket).

As shown, for some examples, the third surface mount pad 106 is disposed closer to the first surface mount pad 102 than the second surface mount pad 108 is disposed to the first surface mount pad 102. Additionally, for some examples, one or more additional surface mount pads are disposed between the third surface mount pad 106 and the first surface mount pad 102. In this way, a plurality of surface mount pads can be arranged in closer proximity to the first surface mount pad than might otherwise be possible. Additionally, such an arrangement of surface mount pads can facilitate a dense layout of card-edge connectors (e.g., Dual in-line Memory Module [DIMM] sockets) adjacent to a semiconductor chip interfaced with the card-edge connectors.

Depending on the example, the PCB 100 may be part of an electronic system, such as a computer memory system or computer main board. According to some examples, the arrangement of vias and routes illustrated permits a high density of surface mounted components to be disposed on the surface 104 of the PCB 100 within a smaller footprint than otherwise possible. This may, for instance, allow for a plurality of card-edge connectors (e.g., memory module sockets) to be positioned more closely together on the surface 104 of the PCB 100, and for the plurality as whole to be positioned closer to a semiconductor chip (e.g., a memory chip, such as memory buffer chip) to which the plurality is conductively coupled.

FIG. 1 illustrates the microvia 110 as being disposed to the left of the second through-hole via 116. For various examples, the microvia 110 may be disposed to the right of the second through-hole via 116 such that the second route 112 extends right from the second through-hole via 116 toward the microvia 110.

Figure 2:
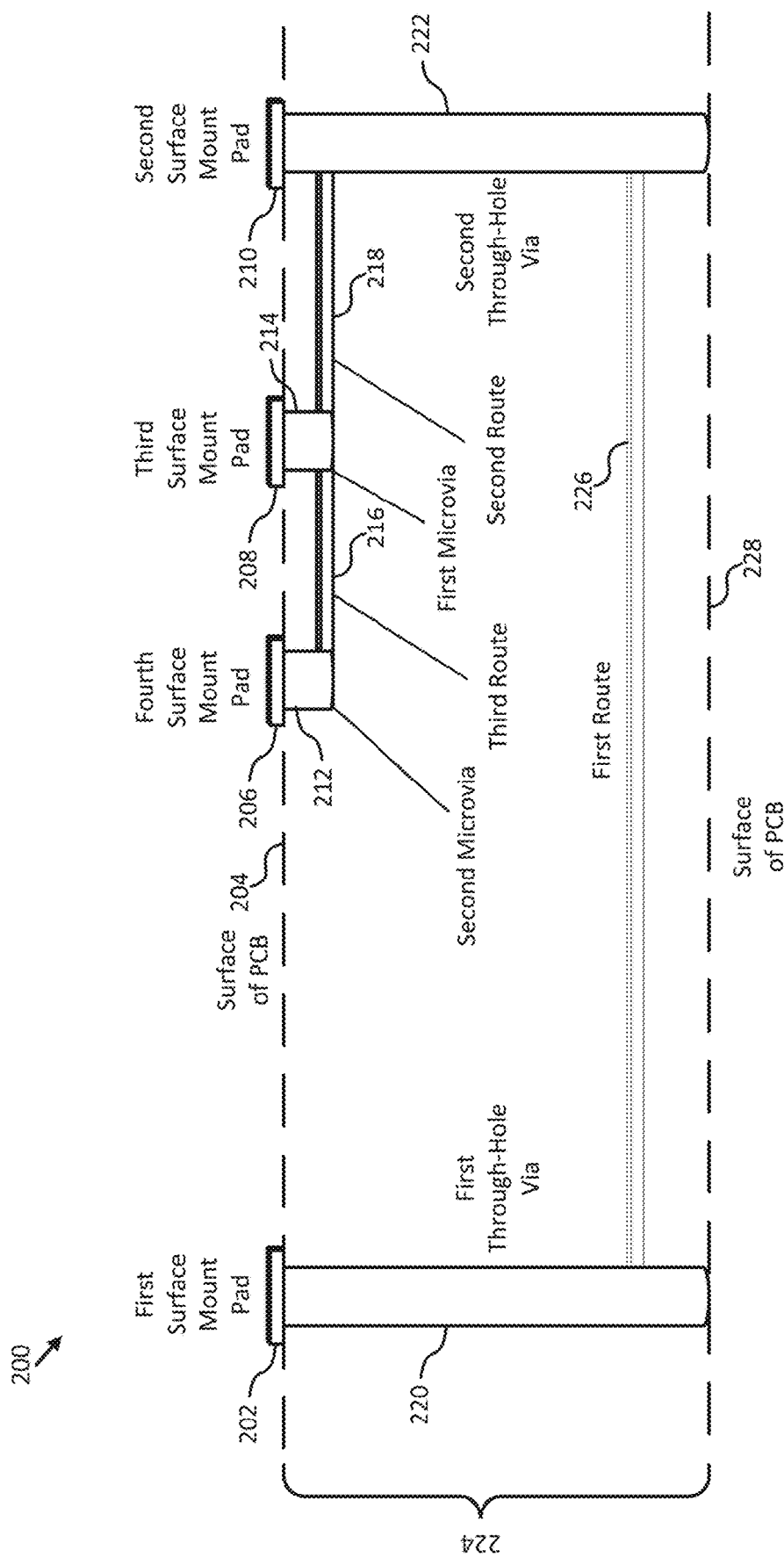

FIG. 2 is a block diagram illustrating an example printed circuit board (PCB) 200 according to the present disclosure. Similar to FIG. 1, FIG. 2 illustrates a cross section 224 of the PCB 200, which may comprise a plurality of internal layers (not shown) that permit conductive routing between internal points of the PCB 200, such as between two vias that extend through internal layers of the PCB 200. For some examples, the PCB 200 comprises twenty-four layers.

As illustrated, the PCB 200 comprises: a (top) surface 204 and a (bottom) surface 228; a first surface mount pad 202, a second surface mount pad 210, a third surface mount pad 208, and a fourth surface mount pad 206 disposed on the surface 204 of the PCB 200; a first microvia 214 conductively coupled to the third surface mount pad 208; a second microvia 212 conductively coupled to the fourth surface mount pad 206; a first through-hole via 220 conductively coupled to the first surface mount pad 202; a second through-hole via 222 conductively coupled to the second surface mount pad 210; a third route 216 coupling the second microvia 212 to the first microvia 214; a second route 218 conductively coupling the first microvia 214 and the second through-hole via 222; and a first route 226 conductively coupling the first through-hole via 220 and the second through-hole via 222. One or more of components 202, 206, 208, 210, 212, 214, 216, 218, 220, 222, 226, and 228 may comprise copper.

As shown, the second and third routes 216, 218 may be disposed on the same internal layer of the printed circuit board (PCB) 200, thereby daisy chaining the first microvia 214 and the second microvia 212 from the second through-hole via 222. For some examples, the second and third routes 216, 218 are disposed on a different internal layer of the PCB 200 than the first route 226 is disposed. Additionally, for some examples, the second and third routes 216, 218 are disposed on a higher internal layer of the PCB 200 (e.g., third internal layer) and the first route 226 is disposed on a lower internal layer of the PCB 200 (e.g., twentieth internal layer). As shown, the second and third routes 216, 218 are disposed on an internal layer of the PCB 200 that intersects with the first microvia 214, the second microvia 212, and the second through-hole via 222, while the first route 226 is disposed on an internal layer that intersects with the first through-hole via 220 and the second through-hole via 222.

The first and second through-hole vias 220, 222 of the PCB 200 may be similar to the first and second through-hole vias 114, 116 of the PCB 100 described above with respect to FIG. 1. The first and second microvias 212, 214 of the PCB 200 may be similar to the microvia 110 of the PCB 100 described above with respect to FIG. 1. Likewise, the first, second, third, and fourth surface mount pads 202, 206, 208, 210 of the PCB 200 may be similar to the first, second, and third surface mount pads 102, 106, 108 of the PCB 100 described above with respect to FIG. 1. Additionally, like the PCB 100 of FIG. 1, the PCB 200 may be part of an electronic system (e.g., computer memory system), and may permit a high density of surface mounted components (e.g., memory chip and memory module sockets) to be disposed on the surface 204 of the PCB 100 within a smaller footprint than otherwise possible.

FIG. 2 illustrates the first and second microvias 212, 214 as being disposed to the left of the second through-hole via 222. For various examples, the first and second microvias 212, 214 may be disposed to the right of the second through-hole via 222 such that the second route 218 extends right from the second through-hole via 222 toward the first microvia 214 and such that the third route 216 extends right from the first microvia 214 toward the second microvia 212.

Figure 3:
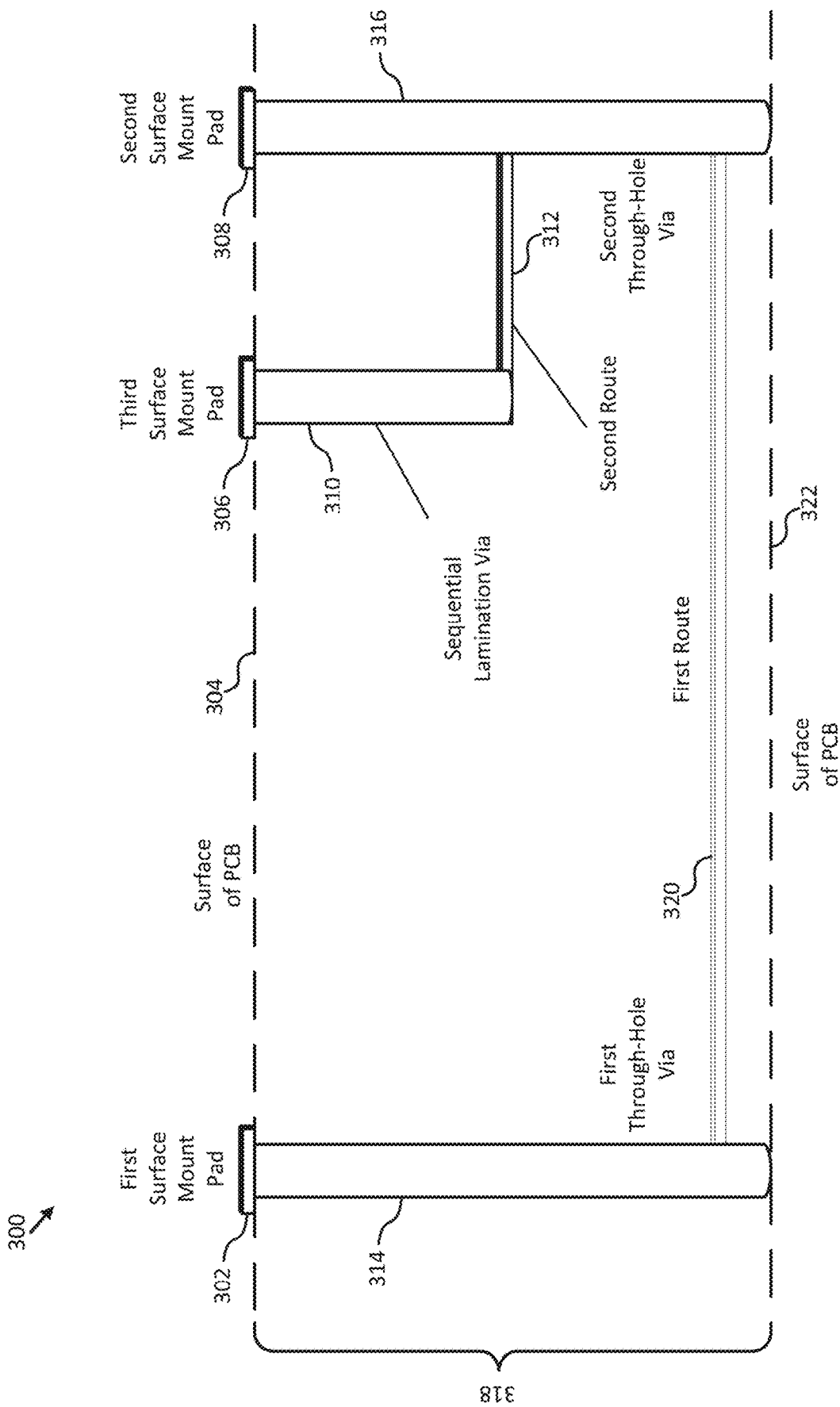

FIG. 3 is a block diagram illustrating an example printed circuit board 300 according to the present disclosure. Similar to FIG. 1, FIG. 3 illustrates a cross section 318 of the PCB 300, which may comprise a plurality of internal layers (not shown) that permit conductive routing between internal points of the PCB 300, such as between two vias that extend through internal layers of the PCB 300. For some examples, the PCB 300 comprises twenty-four layers.

As illustrated, the PCB 300 comprises: a (top) surface 304 and a (bottom) surface 322; a first surface mount pad 302, a second surface mount pad 308, and a third surface mount pad 306 disposed on the surface 304 of the PCB 300; a sequential lamination via 310 conductively coupled to the third surface mount pad 306; a first through-hole via 314 conductively coupled to the first surface mount pad 302; a second through-hole via 318 conductively coupled to the second surface mount pad 308; a second route 312 conductively coupling the sequential lamination via 310 and the second through-hole via 318; and a first route 320 conductively coupling the first through-hole via 314 and the second through-hole via 316. One or more of components 302, 306, 308, 310, 312, 314, 318, and 320 may comprise copper.

For some examples, each of the second route 312 and the first route 320 are disposed separate internal layers of the printed circuit hoard (PCB) 300. Additionally, for some examples, the second route 312 is disposed on a higher internal layer of the PCB 300 (e.g., tenth internal layer) and the first route 320 is disposed on a lower internal layer of the PCB 300 (e.g., twentieth internal layer). As shown, the second route 312 is disposed on an internal layer of the PCB 300 that intersects with the sequential lamination via 310 and the second through-hole via 316, and the route 320 is disposed on an internal layer that intersects with the first through-hole via 314 and the second through-hole via 316.

According to some examples, the first and second through-hole vias 314, 316 extend from the top surface 304 of the PCB 300 to the bottom surface 306 of the PCB 100. Additionally, for some examples, the sequential lamination via 310 extends down from the top surface 304 nine or ten internal layers.

For some examples, components 302, 306, 308, 314, 316, and 320 of the PCB 300 are similar (e.g., arrangement, structure, function, etc.) to components 102, 106, 108, 114, 116, and 120 of the PCB 100 described above with respect to FIG. 1.

FIG. 3 illustrates the sequential lamination via 310 as being disposed to the left of the second through-hole via 316. For various examples, the sequential lamination via 310 may be disposed to the right of the second through-hole via 316 such that the second route 312 extends right from the second through-hole via 316 toward the sequential lamination via 310.

Figure 4:
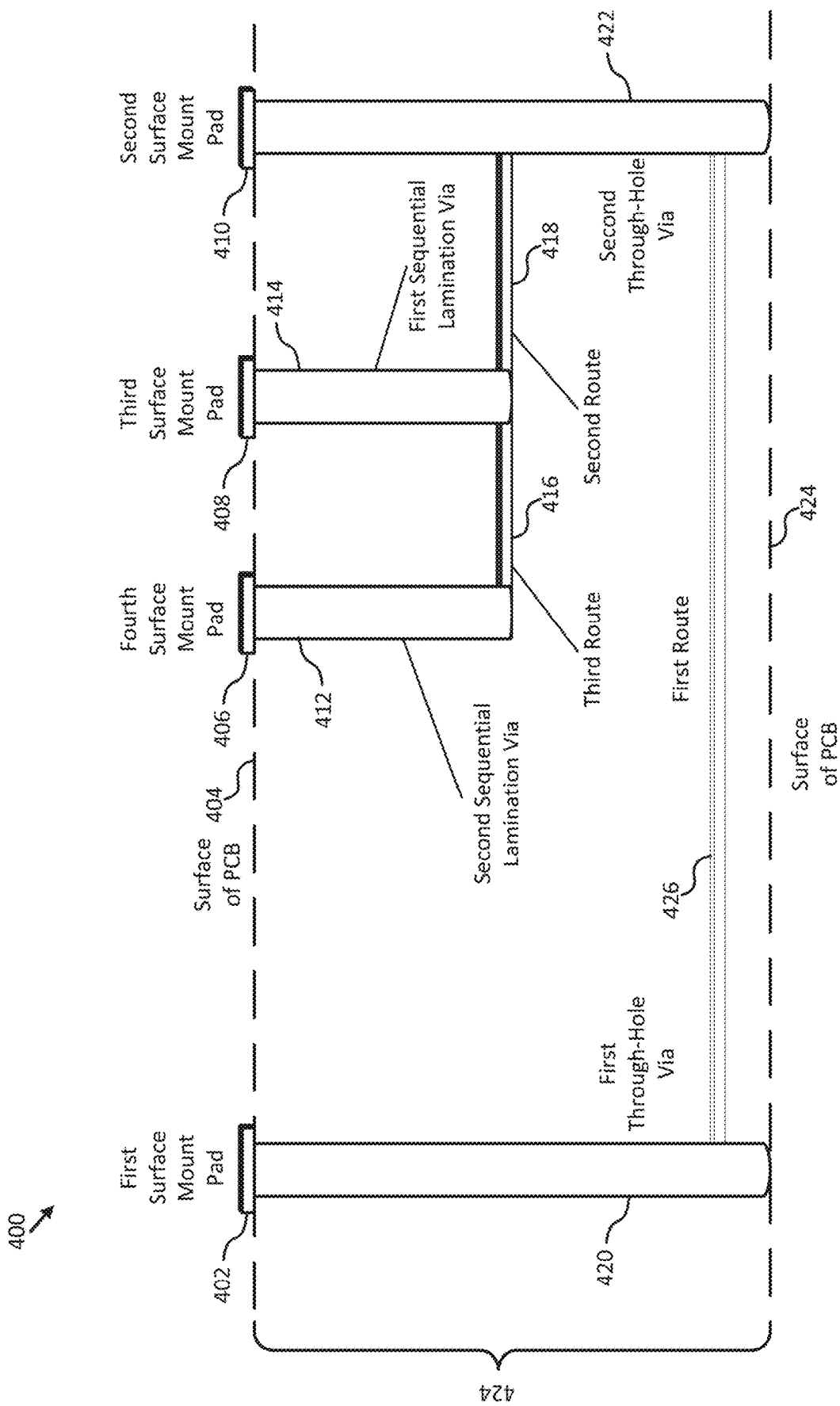

FIG. 4 is a block diagram illustrating an example printed circuit board 400 according to the present disclosure. Similar to FIG. 2, FIG. 4 illustrates a cross section 424 of the PCB 400, which may comprise a plurality of internal layers (not shown) that permit conductive routing between internal points of the PCB 400, such as between two vias that extend through internal layers of the PCB 400. For some examples, the PCB 400 comprises twenty-four layers.

As illustrated, the PCB 400 comprises: a (top) surface 404 and a (bottom) surface 424; a first surface mount pad 402, a second surface mount pad 410, a third surface mount pad 408, and a fourth surface mount pad 408 disposed on the surface 404 of the PCB 400; a first sequential lamination via 414 conductively coupled to the third surface mount pad 408; a second sequential lamination via 412 conductively coupled to the fourth surface mount pad 406; a first through-hole via 420 conductively coupled to the first surface mount pad 402; a second through-hole via 422 conductively coupled to the second surface mount pad 410; a third route 416 coupling the second sequential lamination via 412 and the first sequential lamination via 414; a second route 418 conductively coupling the first sequential lamination via 414 and the second through-hole via 422; and a first route 426 conductively coupling the first through-hole via 420 and the second through-hole via 422. One or more of components 402, 406, 408, 410, 412, 414, 416, 418, 420, 422, 426, and 428 may comprise copper.

As shown, the second and third routes 416, 418 may be disposed on the same internal layer of the printed circuit board (PCB) 400, thereby daisy chaining the first sequential lamination via 414 and the second sequential lamination via 412 from the second through-hole via 422. For some examples, the second and third routes 416, 418 are disposed on a different internal layer of the PCB 400 than the first route 426 is disposed. Additionally, for some examples, the second and third routes 416, 418 are disposed on a higher internal layer of the PCB 400 (e.g., tenth internal layer) and the first route 426 is disposed on a lower internal layer of the PCB 400 (e.g., twentieth internal layer). As shown, the second and third routes 416, 418 are disposed on an internal layer of the PCB 400 that intersects with the first sequential lamination via 414, the second sequential lamination via 412, and the second through-hole via 422, while the first route 426 is disposed on an internal layer that intersects with the first through-hole via 420 and the second through-hole via 422.

The first and second through-hole vias 420, 422 of the PCB 400 may be similar to the first and second through-hole vias 314, 316 of the PCB 300 described above with respect to FIG. 3. The first and second sequential lamination vias 412, 414 of the PCB 400 may be similar to the sequential lamination via 310 of the PCB 300 described above with respect to FIG. 3. Likewise, the first, second, third, and fourth surface mount pads 402, 406, 408, 410 of the PCB 400 may be similar to the first, second, and third surface mount pads 302, 306, 308 of the PCB 300 described above with respect to FIG. 3. Additionally, like the PCB 300 of FIG. 3, the PCB 400 may be part of an electronic system (e.g., computer memory system), and may permit a high density of surface mounted components (e.g., memory chip and memory module sockets) to be disposed on the surface 404 of the PCB 300 within a smaller footprint than otherwise possible.

FIG. 4 illustrates the first and second sequential lamination vias 412, 414 as being disposed to the left of the second through-hole via 422. For various examples, the first and second sequential lamination vias 412, 414 may be disposed to the right of the second through-hole via 422 such that the second route 418 extends right from the second through-hole via 422 toward the first sequential lamination via 414 and such that the third route 416 extends right from the first microvia 414 toward the second sequential lamination via 412.

Figure 5A:
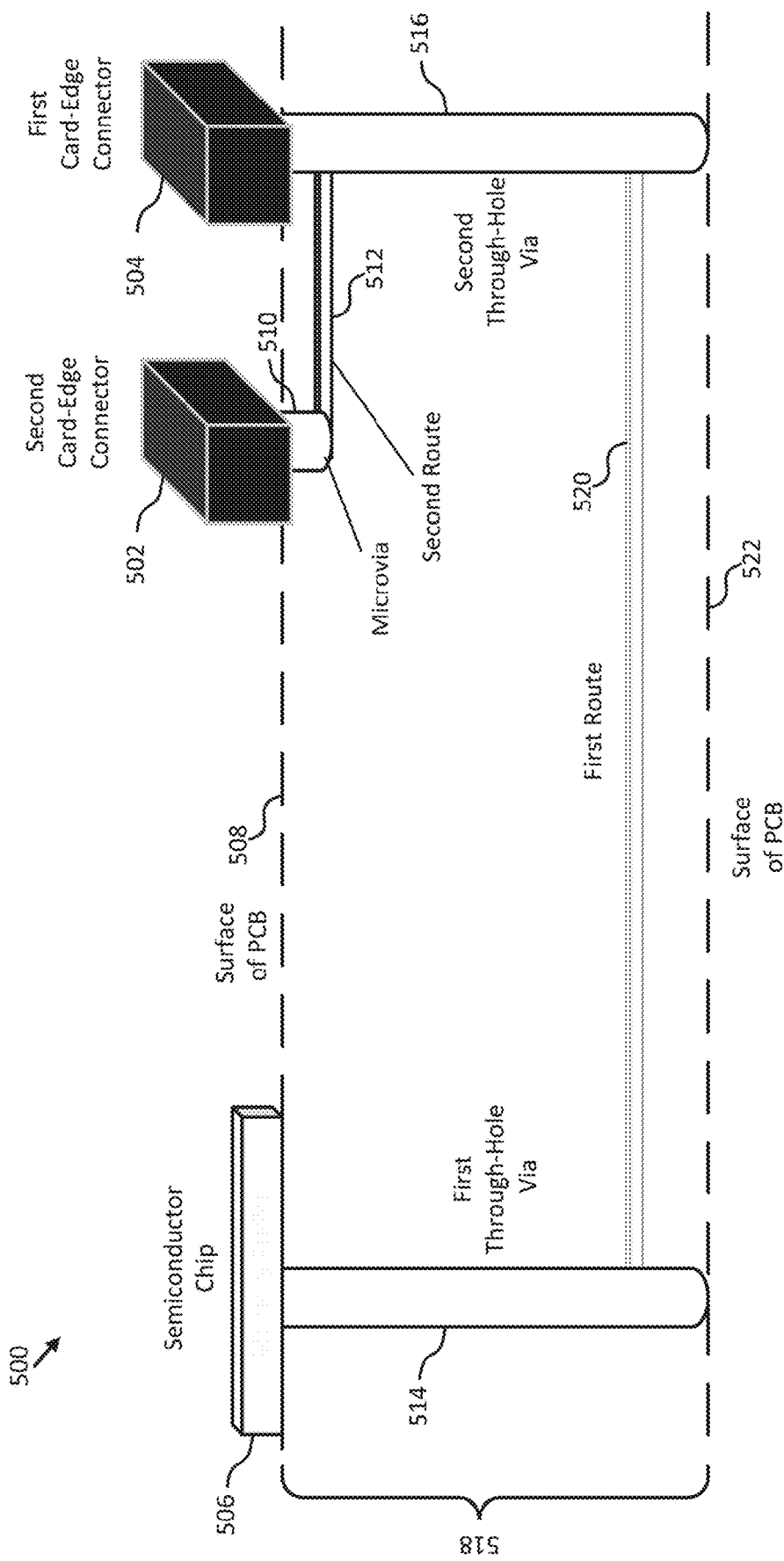

FIG. 5A is a block diagram illustrating a first view of an example printed circuit board (PCB) 500 according to the present disclosure. Similar to FIG. 1, FIG. 5A illustrates a cross section 818 of the PCB 500, which may comprise a plurality of internal layers (not shown) that permit conductive routing between internal points of the PCB 500, such as between two vias that extend through infernal layers of the PCB 500. For some examples, the PCB 500 comprises twenty-four layers.

As illustrated, the PCB 500 comprises: a (top) surface 508 and a (bottom) surface 522; a semiconductor chip 506 disposed on the surface 508, a first card-edge connector 504 and a second card-edge connector 502 disposed on the surface 504 of the PCB 500; a microvia 510 conductively coupled to the second card-edge connector 502; a first through-hole via 514 conductively coupled to the semiconductor chip 506; a second through-hole via 516 conductively coupled to the first card-edge connector 504; a second route 512 conductively coupling the microvia 510 and the second through-hole via 516; and a first route 520 conductively coupling the first through-hole via 514 and the second through-hole via 516. One or more of components 502, 506, 508, 510, 512, 514, 516, and 520 may comprise copper.

Depending on the example, the semiconductor chip 506 may comprise a controller or buffer chip, such as a memory buffer chip, which interfaces with the first and second card-edge connectors 502, 504. Each of the card-edge connectors may comprise a memory module socket, a computer expansion slot (e.g., Peripheral Component interconnect [PCI] or PCI-Express [PCI-E] expansion slot), or the like.

For some examples, the semiconductor chip 506 is conductively coupled to the first through-hole via 514 by way of a surface mount pad disposed on the surface 508. Likewise, the first card-edge connector 504 may be conductively coupled to the second through-hole via 516 by way of a surface mount pad disposed on the surface 508, and the second card-edge connector 502 may be conductively coupled to the microvia 510 by way of a surface mount pad disposed on the surface 508. The first through-hole via 514 may be coupled to a pin of the semiconductor chip 506, the second through-hole via 516 may be coupled to a pin of the first card-edge connector 504, and the microvia 510 may be coupled to a pin of the second card-edge connector 502.

Depending on the space available on the surface 508, additional card-edge connectors may be disposed on the surface 508 between the second card-edge connector 502. Each of these additional card-edge connectors may be conductively coupled to its own microvia, which may be daisy chained from the microvia 510 by way of a route disposed on the same internal layer as the second route 512.

For some examples, components 510, 512, 514, 516, and 520 of the PCB 500 are similar (e.g., arrangement, structure, function, etc.) to components 110, 112, 114, 116, and 120 of the PCB 100 described above with respect to FIG. 1.

FIG. 5A illustrates the microvia 510 and the second card-edge connector 502 as being disposed to the left of the second through-hole via 516. For various examples, the microvia 510 and the second card-edge connector 502 may be disposed to the right of the second through-hole via 516 such that the second route 512 extends right from the second through-hole via 516 toward the microvia 510.

Figure 5B:
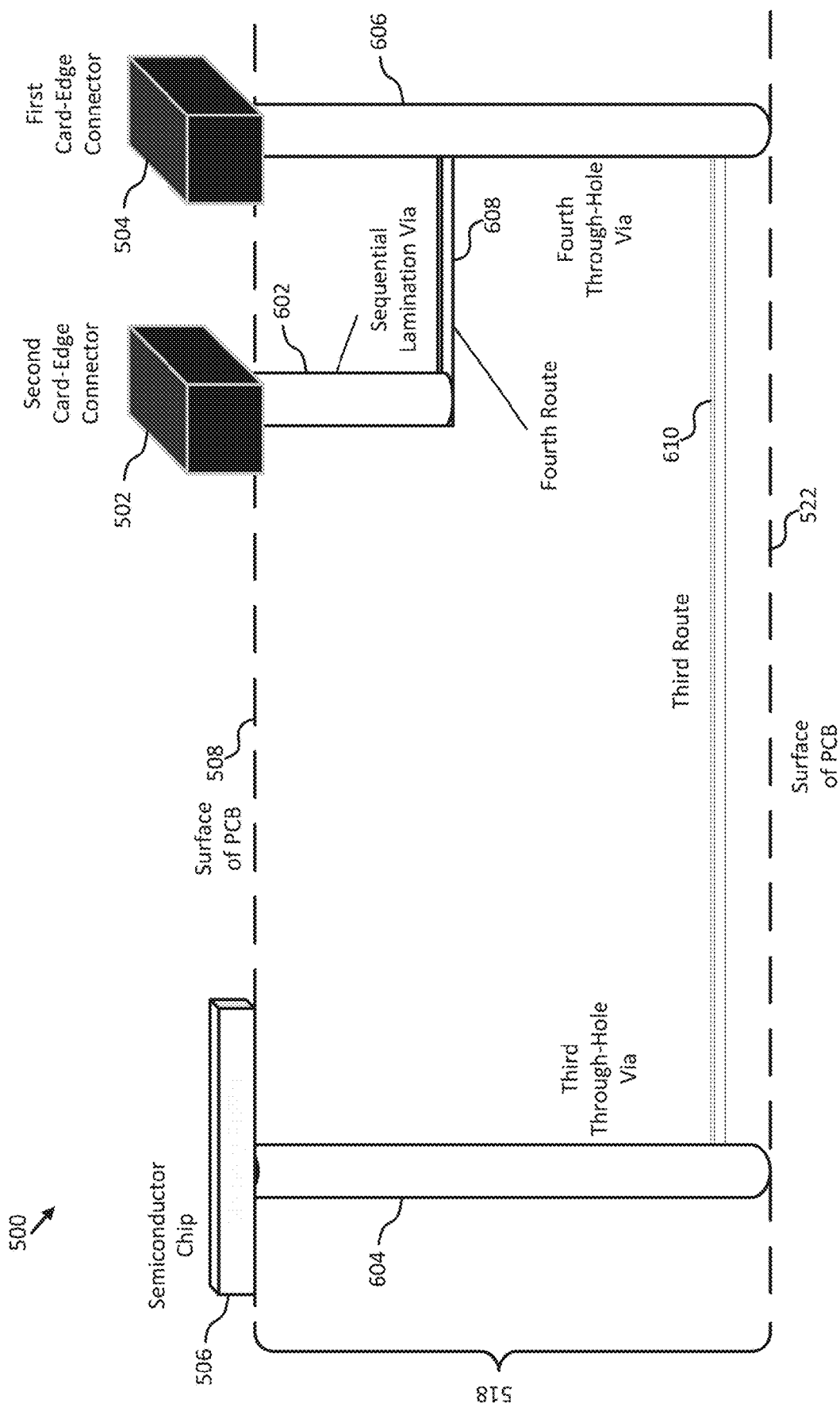

FIG. 5A illustrates, how a portion of the PCB 500 may utilize through-hole vias and microvias to interconnect pins of the semiconductor chip 506 and the first and second card-edge connectors 502, 504. FIG. 5B illustrates how another portion of the PCB 500 may utilize through-hole vias and sequential lamination vias to interconnect other pins of the semiconductor chip 506 and the first and second card-edge connectors 502, 504. FIGS. 5A and 5B illustrate how both strategies of using routes and vias described herein can be utilized in the same printed circuit board (e.g., based on route congestion).

FIG. 5B is a block diagram illustrating a second view of the example printed circuit board (PCB) 500 according to the present disclosure. In FIG. 5B, the PCB 500 is shown to further include: a sequential lamination via 602 conductively coupled to the second card-edge connector 502; a third through-hole via 604 conductively coupled to the semiconductor chip 506; a fourth through-hole via 606 conductively coupled to the first card-edge connector 504; a fourth route 808 conductively coupling the sequential lamination via 602 and the fourth through-hole via 608; and a third route 610 conductively coupling the third through-hole via 604 and the fourth through-hole via 606. One or more of components 602, 602, 606, 608, and 610 may comprise copper.

Depending on the example, the semiconductor chip 506 may be conductively coupled to the third through-hole via 604 by way of a surface mount pad disposed on the surface 508, the first card-edge connector 504 may be conductively coupled to the fourth through-hole via 606 by way of a surface mount pad disposed on the surface 508, and the second card-edge connector 502 may be conductively coupled to the sequential lamination via 602 by way of a surface mount pad disposed on the surface 508. As described herein, the third through-hole via 604 may be coupled to a pin of the semiconductor chip 506, the fourth through-hole via 606 may be coupled to a pin of the first card-edge connector 504, and the sequential lamination via 602 may be coupled to a pin of the second card-edge connector 502.

For some examples, components 602, 604, 606, 608, and 610 of the PCB 500 are similar (e.g., arrangement, structure, function, etc.) to components 310, 312, 314, 316, and 320 of the PCB 300 described above with respect to FIG. 3.

FIG. 5B illustrates the sequential lamination via 602 and the second card-edge connector 502 as being disposed to the left of the fourth through-hole via 606. For various examples, the sequential lamination via 602 and the second card-edge connector 502 may be disposed to the right of the fourth through-hole via 606 such that the fourth route 608 extends right from the fourth through-hole via 606 toward the sequential lamination via 602.

Figure 6:
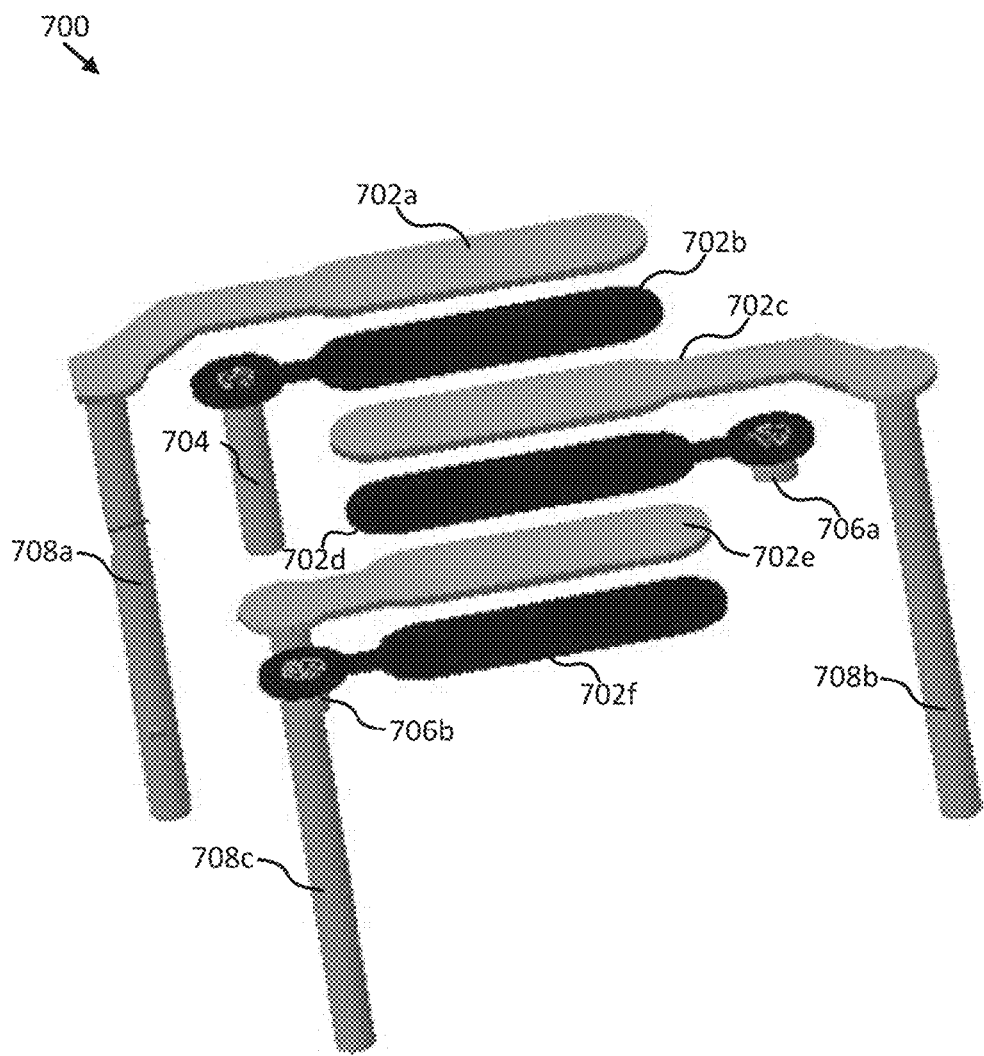
FIG. 6 is a rendering illustrating example use of surface mount pads, vias and routes according to the present disclosure.

FIG. 6 is a rendering 700 illustrating example use of surface mount pads, vias and routes according to the present disclosure. In particular, the rendering 700 provides a perspective view of surface mount pads 702a, 702b, 702c, 702d, 702e, and 702f being used in conjunction with microvias 706a and 706b, a sequential lamination via 704, through-hole vias 706a, 708b, and 708c as described herein. As shown, the surface mount pad 702a is conductively coupled to the through-hole via 708a, the surface mount pad 702b is conductively coupled to the sequential lamination via 704, the surface mount pad 702c is conductively coupled to the through-hole via 708b, the surface mount pad 702d is conductively coupled to the microvia 706a, the surface mount pad 702e is conductively coupled to the through-hole via 708c, and the surface mount pad 702f is conductively coupled to the microvia 708b.

In the foregoing description, numerous details are set forth to provide an understanding of the subject disclosed herein. However, various examples may be practiced without some or all of these details. Some examples may include modifications and variations from the details discussed above. It is intended that the appended claims cover such modifications and variations.

The invention claimed is:

1. An electronic system, comprising: a printed circuit board having a plurality of internal layers disposed between a first surface and a second surface; a plurality of card-edge connectors disposed on the first surface; and a semiconductor chip disposed on the first surface, wherein the printed circuit board includes: a first through-hole via conductively coupled to the semiconductor chip; a second through-hole via conductively coupled to a first card-edge connector of the plurality of card-edge connectors; a first route that conductively couples the first through-hole via to the second through-hole via on a first internal layer of the plurality of internal layers; a first microvia via conductively coupled to a second card-edge connector of the plurality of card-edge connectors; and a second route that conductively couples the second through-hole via to the first microvia on a second internal layer of the plurality of internal layers; wherein: the first microvia extends through one or more of the internal layers without extending to both the first surface and the second surface; and the first through-hole via and the second through-hole via extend through the printed circuit board to both the first surface and the second surface; wherein the printed circuit board includes: a third through-hole via conductively coupled to the semiconductor chip; a fourth through-hole via conductively coupled to the first card-edge connector: a third route that conductively couples the third through-hole via to the fourth through-hole via on the first internal layer; a first sequential lamination via conductively coupled to the second card-edge connector; and a fourth route that conductively couples the fourth through-hole via to the first sequential lamination via on a third internal layer of the plurality of internal layers; wherein: the third through-hole via and the fourth through-hole via extend through the printed circuit board to both the first surface and the second surface; and the sequential lamination via extends through one or more of the internal layers without extending to both the first surface and the second surface.

2. The electronic system of claim 1, wherein the third internal layer is disposed between the first internal layer and the second internal layer.

3. The electronic system of claim 1, wherein the printed circuit board further comprises a sequential lamination via.

* * * * *